United States Patent
Liao

(10) Patent No.: US 10,601,336 B2
(45) Date of Patent: Mar. 24, 2020

(54) POWER SUPPLY

(71) Applicant: Wentai Technology Corporation, New Taipei (TW)

(72) Inventor: Yuan-Liang Liao, New Taipei (TW)

(73) Assignee: WENTAI TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/359,976

(22) Filed: Mar. 20, 2019

(65) Prior Publication Data

US 2019/0326830 A1 Oct. 24, 2019

(30) Foreign Application Priority Data

Apr. 24, 2018 (TW) .............................. 107205297 U

(51) Int. Cl.
*H02M 7/219* (2006.01)
*H02M 7/23* (2006.01)
*H03K 7/08* (2006.01)
*H02M 1/00* (2006.01)

(52) U.S. Cl.
CPC .............. *H02M 7/219* (2013.01); *H02M 7/23* (2013.01); *H03K 7/08* (2013.01); *H02M 2001/0012* (2013.01)

(58) Field of Classification Search
CPC ...... H02M 3/155; H02M 3/156; H02M 3/158; H02M 7/537; H02M 7/5387; H02M 7/53871; H02M 7/53873; H02M 7/219; H02M 7/23; H02M 7/08; H02M 1/00
See application file for complete search history.

(56) References Cited

U.S. PATENT DOCUMENTS

| | | | | |
|---|---|---|---|---|
| 6,018,700 A | * | 1/2000 | Edel ................... | G01R 19/2513 361/18 |
| 8,350,678 B1 | * | 1/2013 | Xiong ................ | H05B 37/0263 340/12.31 |
| 9,373,997 B1 | * | 6/2016 | Lin ...................... | H02M 1/4225 |
| 9,541,941 B2 | * | 1/2017 | Ramorini ............... | H02J 50/00 |
| 2010/0084918 A1 | * | 4/2010 | Fells ....................... | H02J 5/005 307/32 |
| 2013/0221871 A1 | * | 8/2013 | King ..................... | H05B 37/02 315/254 |
| 2015/0207333 A1 | * | 7/2015 | Baarman .................. | H02J 5/005 307/104 |
| 2016/0028257 A1 | * | 1/2016 | Hashimoto ......... | H01M 10/441 320/112 |
| 2018/0145586 A1 | * | 5/2018 | Wang ................... | H02M 1/4225 |

* cited by examiner

*Primary Examiner* — Adolf D Berhane
*Assistant Examiner* — Nusrat Quddus
(74) *Attorney, Agent, or Firm* — Sinorica, LLC

(57) ABSTRACT

A load adaptive power supply including: a conducting resistance controllable bridge rectifying unit for generating a full-wave rectified output voltage according to an AC input voltage to drive a load, and controlling an on-resistance thereof during at least one half cycle of a positive half cycle and a negative half cycle of the AC input voltage according to at least one control signal; a driving circuit unit configured to generate the at least one control signal according to a pulse modulation signal; and a digital microcontroller unit coupled with the driving circuit unit to determine a duty ratio of the pulse modulation signal according to a power of the load to drive the driving circuit unit, so as to adjust the on-resistance of the conducting resistance controllable bridge rectifying unit according to different values of the power, thereby increasing a power conversion efficiency of the power supply.

1 Claim, 1 Drawing Sheet

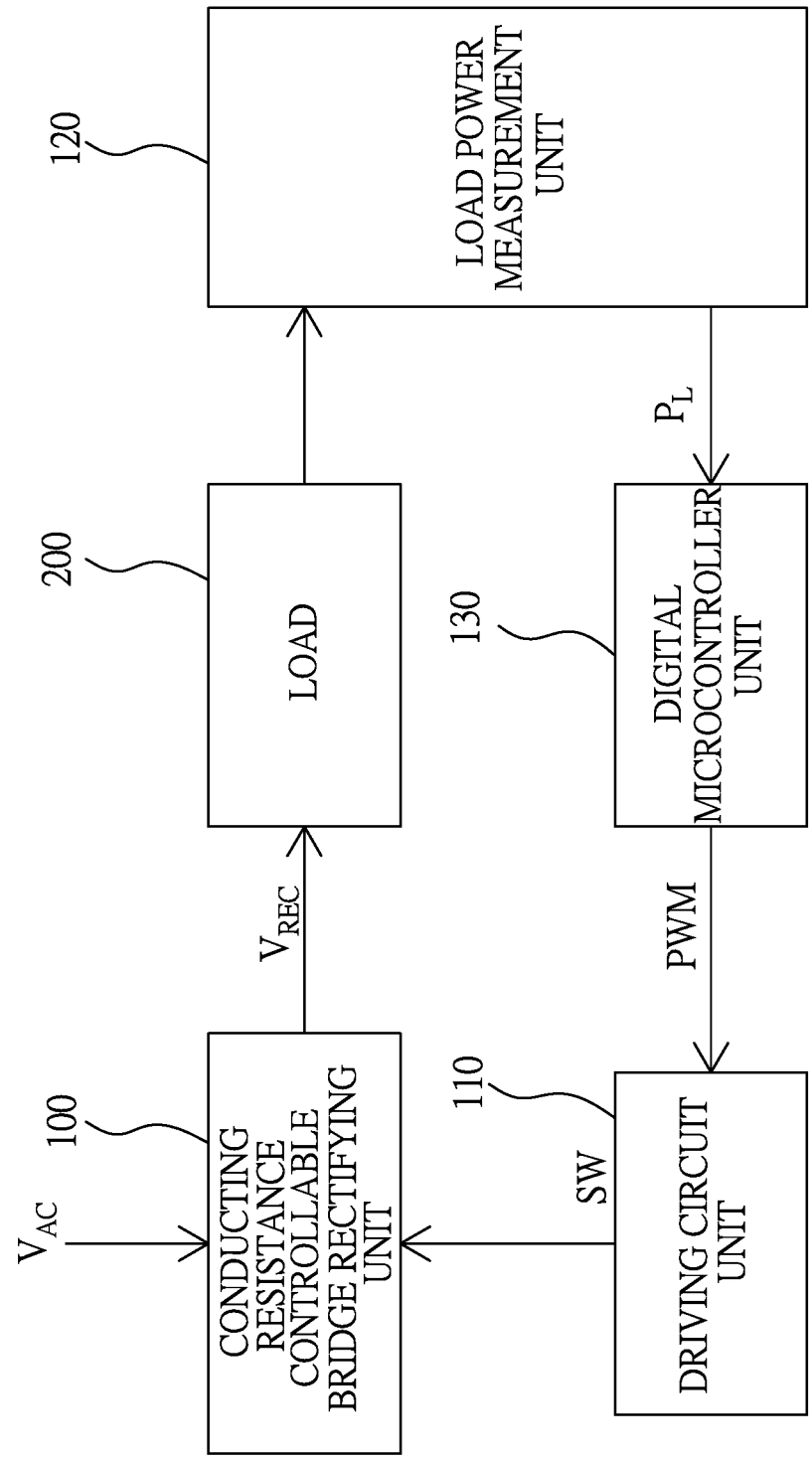

POWER SUPPLY

BACKGROUND OF THE INVENTION

Field of the Invention

The present invention relates to a power supply, especially to a load adaptive power supply.

Description of the Related Art

In various power converter applications, there are different requirements for power conversion efficiency. Currently known energy efficiency grades can be divided into five different grades: white, bronze, silver, gold, platinum, and titanium. Among the five different grades, the titanium is the highest grade, which apart from requiring higher energy efficiency values at 20%, 50%, and 100% of a full load compared with the other four grades, further requires a strict energy efficiency value at 10% of the full load.

However, it is not easy to achieve the specified energy efficiency values from very light loads to heavy loads. Therefore, there is a need in the field for a novel power supply structure.

SUMMARY OF THE INVENTION

An objective of the present invention is to disclose a load adaptive power supply that can react to a power of a load by a digital microcontroller unit to adjust an on-resistance of a conducting resistance controllable bridge rectifying unit according to different values of the power of the load ranging from light loads to heavy loads, thereby promoting power efficiency and saving energy.

To attain the foregoing objective, a load adaptive power supply is proposed, including:

a conducting resistance controllable bridge rectifying unit for generating a full-wave rectified output voltage according to an AC input voltage to drive a load, the conducting resistance controllable bridge rectifying unit having at least one control end for receiving at least one control signal to control an on-resistance of the conducting resistance controllable bridge rectifying unit during at least one half cycle of a positive half cycle and a negative half cycle of the AC input voltage;

a driving circuit unit coupled with the conducting resistance controllable bridge rectifying unit for generating the at least one control signal according to a pulse modulation signal;

a load power measurement unit for measuring a power of the load; and a digital microcontroller unit coupled with the driving circuit unit and the load power measurement unit to determine a duty ratio of the pulse modulation signal according to the power to drive the driving circuit unit, so as to adjust the on-resistance of the conducting resistance controllable bridge rectifying unit according to different values of the power, and thereby increase a power conversion efficiency of the load adaptive power supply.

In one embodiment, the conducting resistance controllable bridge rectifying unit includes four rectifying elements, and at least one of the rectifying elements is a conducting resistance controllable rectifying element having a variable on-resistance controlled by one of the at least one control signal.

In one embodiment, the conducting resistance controllable rectifying element includes a diode and a transistor, where two ends of the diode are connected in parallel with a channel of the transistor, and a control end of the transistor is coupled with one of the at least one control signal.

In one embodiment, the transistor is a field effect transistor.

In one embodiment, the digital microcontroller unit has a memory unit to store a control program.

To make it easier for our examiner to understand the objective of the invention, its structure, innovative features, and performance, we use preferred embodiments together with the accompanying drawings for the detailed description of the invention.

BRIEF DESCRIPTION OF THE DRAWINGS

FIG. 1 illustrates a block diagram of an embodiment of a load adaptive power supply of the present invention.

DETAILED DESCRIPTION OF THE PREFERRED EMBODIMENTS

Please refer to FIG. 1, which illustrates a block diagram of an embodiment of a load adaptive power supply of the present invention. As illustrated in FIG. 1, the load adaptive power supply has a conducting resistance controllable bridge rectifying unit 100, a driving circuit unit 110, a load power measurement unit 120, and a digital microcontroller unit 130.

The conducting resistance controllable bridge rectifying unit 100 is configured to generate a full-wave rectified output voltage $V_{REC}$ according to an AC input voltage $V_{AC}$ to drive a load 200, and the conducting resistance controllable bridge rectifying unit 100 has at least one control end for controlling the on-resistance thereof during at least one half cycle of a positive half cycle and a negative half cycle of the AC input voltage $V_{AC}$ according to at least one control signal SW. In one embodiment, the conducting resistance controllable bridge rectifying unit 100 includes four rectifying elements (not shown in FIG. 1), and at least one of the rectifying elements is a conducting resistance controllable rectifying element. That is, at least one of the rectifying elements has a variable on-resistance controlled by one of the at least one control signal. For example, the conducting resistance controllable rectifying element may include a diode and a transistor, where two ends of the diode are connected in parallel with a channel of the transistor, and a control end of the transistor is coupled with a control signal SW. For possible embodiments, the transistor can be a field effect transistor or other three-terminal power switch.

The driving circuit unit 110 is coupled with the conducting resistance controllable bridge rectifying unit 100, and is configured to generate the at least one control signal SW according to a pulse modulation signal PWM.

The load power measurement unit 120 is configured to measure a power $P_L$ of the load 200 and provide information of the power $P_L$ to the digital microcontroller unit 130.

The digital microcontroller unit 130 has a memory unit for storing a control program, and is coupled with the driving circuit unit 110 and the load power measurement unit 120 to determine a duty ratio of the pulse modulation signal PWM according to the power $P_L$ to drive the driving circuit unit 110, so as to adjust the on-resistance of the conducting resistance controllable bridge rectifying unit 100 according to different values of the power $P_L$, thereby improving the power conversion efficiency of the power supply.

As can be seen from the disclosed design above, the load adaptive power supply of the present invention can react to a power of a load by a digital microcontroller unit to adjust an on-resistance of a conducting resistance controllable bridge rectifying unit according to different values of the power of the load ranging from light loads to heavy loads, thereby promoting power efficiency and saving energy.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. A power supply comprising:
   four rectifying elements for generating a full-wave rectified output voltage according to an AC input voltage to drive a load, the four rectifying elements having at least one control end for receiving at least one control signal to control a resistance of the four rectifying elements during at least one half cycle of a positive half cycle and a negative half cycle of the AC input voltage;
   a driving circuit unit coupled with the four rectifying elements for generating the at least one control signal according to a pulse modulation signal;
   a load power measurement unit for measuring a power of the load;
   a digital microcontroller unit coupled with the driving circuit unit and the load power measurement unit to determine a duty ratio of the pulse modulation signal according to the power to drive the driving circuit unit, so as to adjust the resistance of the four rectifying elements according to different values of the power, and thereby increase a power conversion efficiency of the power supply, wherein the digital microcontroller unit has a memory unit to store a control program;
   at least one of the four rectifying elements having a variable resistance controlled by one of the at least one control signal; and
   the at least one of the four rectifying elements including a diode and a transistor, wherein two ends of the diode are connected in parallel with a channel of the transistor, wherein a control end of the transistor is coupled with one of the at least one control signal, wherein the transistor is a field effect transistor.

* * * * *